(12) United States Patent
Wu et al.

(10) Patent No.: US 10,762,934 B2
(45) Date of Patent: Sep. 1, 2020

(54) LEAKAGE PATHWAY PREVENTION IN A MEMORY STORAGE DEVICE

(71) Applicant: Taiwan Semiconductor Manufacturing Co., Ltd., Hsinchu (TW)

(72) Inventors: Shang-Chi Wu, Hsinchu (TW); Cheng Hung Lee, Hsinchu (TW); Chien-Kuo Su, Kaohsiung County (TW); Chiting Cheng, Taichung (TW); Yu-Hao Hsu, Tainan (TW); Yangsyu Lin, New Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 16/263,904

(22) Filed: Jan. 31, 2019

(65) Prior Publication Data

US 2020/0005835 A1  Jan. 2, 2020

Related U.S. Application Data

(60) Provisional application No. 62/691,129, filed on Jun. 28, 2018.

(51) Int. Cl.
*G11C 7/22* (2006.01)
*G11C 7/10* (2006.01)
*G11C 7/12* (2006.01)

(52) U.S. Cl.
CPC .............. *G11C 7/1096* (2013.01); *G11C 7/12* (2013.01)

(58) Field of Classification Search
CPC ................................ G11C 7/1096; G11C 7/12
USPC ............................................. 365/189.16, 203
See application file for complete search history.

(56) References Cited

U.S. PATENT DOCUMENTS 8,971,133 B1 * 3/2015 Zheng ................. G11C 7/1096
365/189.05

* cited by examiner

*Primary Examiner* — Huan Hoang
(74) *Attorney, Agent, or Firm* — Sterne, Kessler, Goldstein & Fox P.L.L.C.

(57) ABSTRACT

The present disclosure describes various exemplary memory storage devices that can be programmed to write electronic data into one or more memory cells in a write mode of operation and/or to read the electronic data from the one or more memory cells in a read mode of operation. The various exemplary memory storage devices can select various control lines to read the electronic data from the one or more memory cells onto data lines and/or to write the electronic data from these data lines into the one or more memory cells. In some situations, these data lines are charged, also referred to as pre-charged, to a first logical value, such as a logical one, before the various exemplary memory storage devices write the electronic data into the one or more memory cells. During this pre-charging of these data lines, the various exemplary memory storage devices electrically isolate these data lines from specialized circuitry within these exemplary memory storage devices. This specialized circuitry, also referred to as a write driver, writes the electronic data onto these data lines for storage in the one or more memory cells during the write mode of operation.

20 Claims, 6 Drawing Sheets

LEAKAGE PATHWAY PREVENTION IN A MEMORY STORAGE DEVICE

CROSS-REFERENCE TO RELATED APPLICATIONS

The present application claims the benefit of U.S. Provisional Patent Appl. No. 62/691,129, filed Jun. 28, 2018, which is incorporated herein by reference in its entirety.

BACKGROUND

A memory storage device is an electronic device for reading and/or writing electronic data. The memory storage device includes an array of memory cells which can be implemented as volatile memory cells, such as random-access memory (RAM) cells, which require power to maintain its stored information, or non-volatile memory cells, such as read-only memory (ROM) cells, which can maintain its stored information even when not powered. The electronic data can be read from and/or written into the array of memory cells which can be selectable through various control lines. The two basic operations performed by the memory storage device are "read", in which the electronic data stored in the array of memory cells is read out, and "write" in which the electronic data is written in the array of memory cells. During this write mode of operation, the memory storage device charges, also referred to as pre-charges, various control lines of the array of memory cells to write the data in the array of memory cells. However, in some situations, one or more unwanted leakage pathways within the memory storage device can prematurely discharge the various control lines of the array of memory cells before the data is written into the array of memory cells. In these situations, the one or more unwanted leakage pathways can undesirably alter the data which is being written into the array of memory cells. Often times, the memory storage device is required to operate using more power and/or at slower speeds to compensate for the one or more unwanted leakage pathways.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
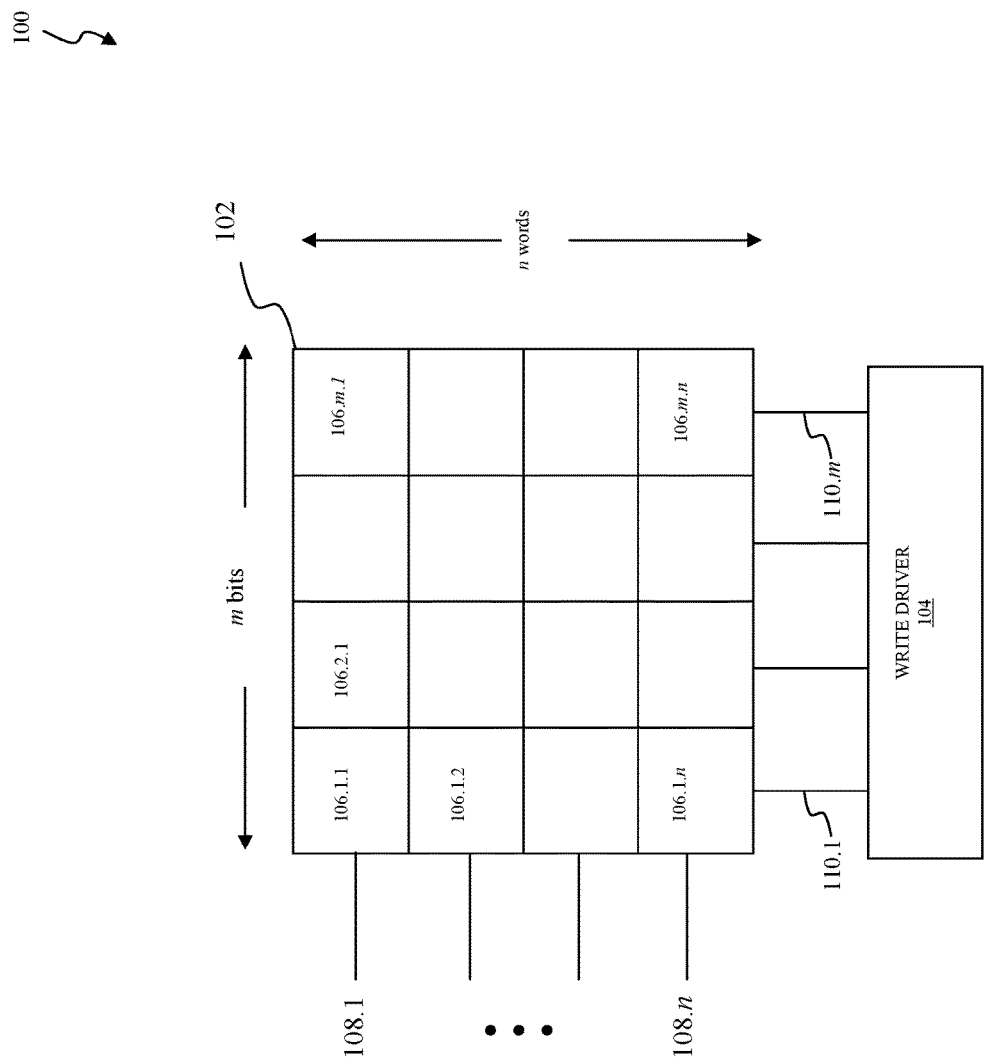
FIG. 1 illustrates a block diagram of an exemplary memory storage device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

The present disclosure describes various exemplary memory storage devices that can be programmed to write electronic data into one or more memory cells in a write mode of operation and/or to read the electronic data from the one or more memory cells in a read mode of operation. The various exemplary memory storage devices can select various control lines to read the electronic data from the one or more memory cells onto data lines and/or to write the electronic data from these data lines into the one or more memory cells. In some situations, these data lines are charged, also referred to as pre-charged, to a first logical value, such as a logical one, before the various exemplary memory storage devices write the electronic data into the one or more memory cells. During this pre-charging of these data lines, the various exemplary memory storage devices electrically isolate these data lines from specialized circuitry within these exemplary memory storage devices. This specialized circuitry, also referred to as a write driver, writes the electronic data onto these data lines for storage in the one or more memory cells during the write mode of operation.

Exemplary Memory Storage Device

FIG. 1 illustrates a block diagram of an exemplary memory storage device according to an exemplary embodiment of the present disclosure. A memory storage device 100 can be programmed to write electronic data into one or more memory cells in a write mode of operation and/or to read the electronic data from the one or more memory cells in a read mode of operation. In the exemplary embodiment illustrated in FIG. 1, a memory storage device 100 can be implemented as a volatile memory storage device, such as a random-access memory (RAM) storage device to provide an example, which requires power to maintain the electronic data, or a non-volatile memory storage device, such as a read-only memory (ROM) storage device to provide an example, which can maintain the electronic data even when not powered. The RAM storage device can be implemented in a dynamic random-access memory (DRAM), a static random-access memory (SRAM), and/or a non-volatile random-access memory (NVRAM), often referred to as a flash memory, configuration to provide some examples. The ROM storage device can be implemented in programmable read-only memory (PROM), a one-time programmable ROM (OTP), an erasable programmable read-only memory (EPROM) and/or an electrically erasable programmable read-only memory (EEPROM) configuration to provide some examples. As to be described in further detail below, the memory storage device 100 can select various control lines to read the electronic data from the one or more memory cells onto data lines and/or to write the electronic data from these control lines into the one or more memory cells. In some situations, these data lines are charged, also referred to as pre-charged, to a first logical value, such as a logical one, before the memory storage device 100 writes the electronic data into the one or more memory cells. During this pre-charging of the data lines, the memory storage device 100 electrically isolates these data lines from specialized circuitry within the memory storage device 100 as to be described in further detail below. This specialized circuitry, also referred to as a write driver, writes the electronic data onto these data lines for storage in the one or more memory cells during the write mode of operation. In the exemplary embodiment illustrated in FIG. 1, the memory storage device 100 includes a memory array 102 and a write driver 104.

Although the discussion of the memory storage device 100 to follow describes the operation of the memory storage device 100 in writing data into the memory array 102 during the write mode of operation, those skilled in the relevant art(s) will recognize the memory storage device 100 can include another specialized circuit, referred to a sense amplifier, to read the electronic data from the memory array 102 during the read mode of operation. The operations of the memory array 102 and the sense amplifier (not shown in FIG. 1) in the read mode of operation are well known and will not be described in further detail. Moreover, although not illustrated in FIG. 1, the memory storage device 100 can include other electronic circuitry, such as a row-address decoder and/or a column-address decoder to provide some examples, which will be apparent to those skilled in the relevant art(s) without departing from the spirit and scope of the present disclosure.

In the exemplary embodiment illustrated in FIG. 1, the memory array 102 includes memory cells 106.1.1 through 106.$m.n$ that are configured into an array of m columns and n rows. However, other arrangements for the memory cells 106.1.1 through 106.$m.n$ are possible without departing from the spirit and scope of the present disclosure. In the exemplary embodiment illustrated in FIG. 1, the memory cells 106.1.1 through 106.$m.n$ are connected to corresponding wordlines (WLs) from among WLs 108.1 through 108.$n$ and corresponding bitlines (BLs) from among BLs 110.1 through 110.$m$. In an exemplary embodiment, the BLs 110.1 through 110.$m$ include BLs 110.1 through 110.$m$ and $\overline{BLs}$ $\overline{110.1}$ through $\overline{110.m}$ with the $\overline{BLs}$ $\overline{110.1}$ through $\overline{110.m}$ representing complements of the BLs 110.1 through 110.$m$. In an exemplary embodiment, the memory cells 106.1.1 through 106.$m.n$ in each of the m columns of the memory array 102 share a common BL from among the BLs 110.1 through 110.$m$. Similarly, the memory cells 106.1.1 through 106.$m.n$ in each of n rows of the memory array 102 share a common WL from among the WLs 108.1 through 108.$n$. For example, as shown in FIG. 1, the memory cells 106.1.1 through 106.$m.1$ of row one of the memory array 102 share the WL 108.1 and the memory cells 106.$m.1$ through 106.$m.n$ of column m of the memory array 102 share the BL 110.$m$.

The write driver 104 writes the electronic data, for example, the first logical value, such as the logical one, or a second logical value, such as a logical zero, onto the BLs 110.1 through 110.$m$ for storage in one or more memory cells from among the memory cells 106.1.1 through 106.$m.n$ in the write mode of operation. In the exemplary embodiment illustrated in FIG. 1, the memory storage device 100 asserts a corresponding WL from among the WLs 108.1 through 108.$n$ to select a row of memory cells from among the memory cells 106.1.1 through 106.$m.n$ in the write mode of operation. Thereafter, the memory storage device 100 charges, also referred to as pre-charges, the BLs 110.1 through 110.$m$ and/or the $\overline{BLs}$ $\overline{110.1}$ through $\overline{110.m}$ to the first logical value, such as the logical one. In this pre-charge phase of the write mode of operation, the write driver 104 is electrically isolated from the BLs 110.1 through 110.$m$ and/or the $\overline{BLs}$ $\overline{110.1}$ through $\overline{110.m}$. In other words, the memory storage device 100 effectively provides a high-impedance (Hi-Z) pathway between the write driver 104 and the BLs 110.1 through 110.$m$ and/or the $\overline{BLs}$ $\overline{110.1}$ through $\overline{110.m}$. In an exemplary embodiment, the impedance of this high-impedance pathway can be in the order of Megaohms (MΩs); however, those skilled in the relevant art(s) will recognize other impedances are possible for this high-impedance pathway without departing from the spirit and scope of the present disclosure. This high-impedance (Hi-Z) pathway effectively prevents one or more unwanted leakage pathways between the BLs 110.1 through 110.$m$ and/or the $\overline{BLs}$ $\overline{110.1}$ through $\overline{110.m}$ and the write driver 104. This allows the memory storage device 100 to operate using less power and/or at greater speeds than if the one or more unwanted leakage pathways were present.

After the BLs 110.1 through 110.$m$ and/or the $\overline{BLs}$ $\overline{110.1}$ through $\overline{110.m}$ are sufficiently pre-charged, the write driver 104 is electrically coupled to the BLs 110.1 through 110.$m$ and/or the $\overline{BLs}$ $\overline{110.1}$ through $\overline{110.m}$ to allow the write driver 104 to write the electronic data onto the BLs 110.1 through 110.$m$ and/or the $\overline{BLs}$ $\overline{110.1}$ through $\overline{110.m}$ for storage into the row of memory cells in the write mode of operation. In other words, the memory storage device 100 effectively provides a low-impedance (Low-Z) pathway between the write driver 104 and the BLs 110.1 through 110.$m$ and/or the $\overline{BLs}$ $\overline{110.1}$ through $\overline{110.m}$ to allow the write driver 104 to write the electronic data into the row of memory cells. In an exemplary embodiment, the impedance of this low-impedance pathway can be in the order of ohms (Ωs); however, those skilled in the relevant art(s) will recognize other impedances are possible for this low-impedance pathway without departing from the spirit and scope of the present disclosure.

Figure 2:
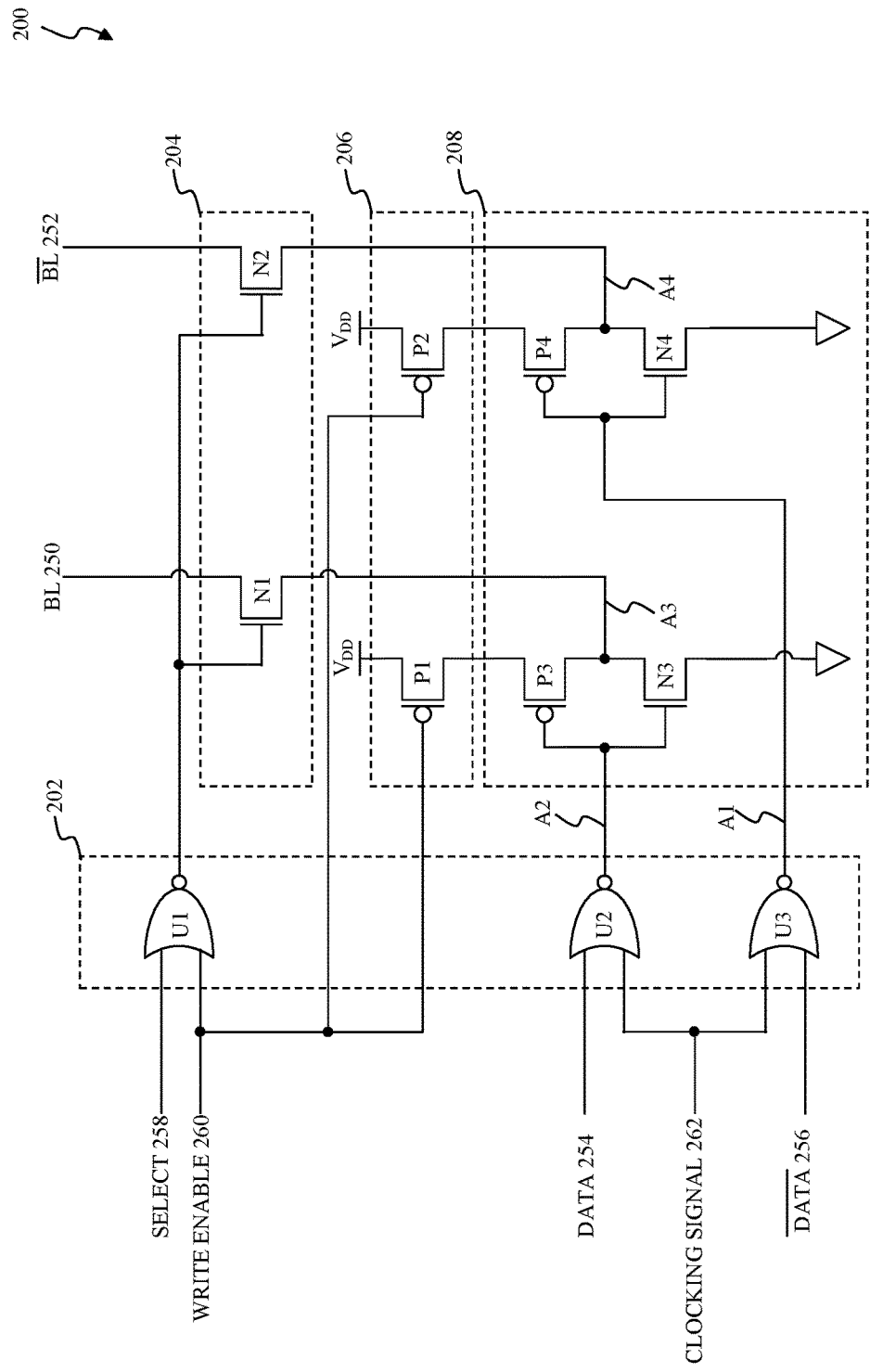
FIG. 2 illustrates a block diagram of a first exemplary write driver that can be implemented within the exemplary memory storage device according to an exemplary embodiment of the present disclosure.

First Exemplary Write Driver can be Implemented within the Exemplary Memory Storage Device FIG. 2 illustrates a block diagram of a first exemplary write driver that can be implemented within the exemplary memory storage device according to an exemplary embodiment of the present disclosure. A write driver 200 writes electronic data, for example, a first logical value, such as a logical one, or a second logical value, such as a logical zero, into a memory cell from among memory cells of a memory array, such as one of the memory cells 106.1.1 through 106.$m.n$ of the memory array 102 to provide an example, in a write mode of operation. As to be described in further detail below, the write driver 200 writes the electronic data onto a bitline (BL) 250 and a $\overline{BL}$ 252, such as one of the BLs 110.1 through 110.$m$ and one of the $\overline{BLs}$ $\overline{110.1}$ through $\overline{110.m}$, respectively, which corresponds to the memory cell. Before the write driver 200 writes the electronic data, the BL 250 and the $\overline{BL}$ 252 are charged, also referred to as pre-charged, to the first logical value, such as the logical one. In this pre-charge phase of the write mode of operation, the write driver 200 is electrically isolated from the BL 250 and the $\overline{BL}$ 252 as to be described in further detail below. In the exemplary embodiment illustrated in FIG. 2, the write driver 200 includes logic circuitry 202, memory cell selection circuitry 204, isolation circuitry 206, and write circuitry 208. The write driver 200 can represent an exemplary embodiment of the write driver 104 as described above in FIG. 1.

The logic circuitry 202 configures the write driver 200 to operate in the write mode of operation to write data 254 and $\overline{data}$ 256 to the BL 250 and the $\overline{BL}$ 252, respectively. In the exemplary embodiment illustrated in FIG. 2, the data 254 represents a complement of the $\overline{data}$ 256. As illustrated in FIG. 2, the logic circuitry 202 includes logical NOR gates U1 through U3; however, those skilled in the relevant art(s) will recognize that other logical gates, such as one or more logical AND gates, one or more logical OR gates, one or more logical INVERTER gates, one or more logical NAND gates, one or more logical XOR gates, or any combination thereof to provide some examples, can alternatively be utilized without departing from the spirit and scope of the present disclosure. In the exemplary embodiment illustrated in FIG. 2, a select control signal 258 is asserted, for example, set to the second logical value, such as the logical zero, to select the memory cell. Moreover, the BL 250 and the $\overline{BL}$ 252 are charged, also referred to as pre-charged, to the first logical value, such as the logical one, in response to the select control signal 258 being asserted during a pre-charge phase of the write mode of operation. Similarly, a write enable control signal 260 is asserted, for example, set to the second logical value, such as the logical zero, to enable the write mode of operation. Otherwise, the write enable control signal 260 is de-asserted, for example, set to the first logical value, such as the logical one, to disable the write mode of operation. As shown in FIG. 2, the logical NOR gate U1 provides the first logical value, such as the logical one, when the select control signal 258 and the write enable control signal 260 are asserted, namely, set to the second logical value, such as the logical zero. As illustrated in FIG. 2, a clocking signal 262 is asserted, for example, set to the second logical value, such as the logical zero, to pass the data 254 and the $\overline{data}$ 256 to the write circuitry 208. In the exemplary embodiment illustrated in FIG. 2, the logical NOR gate U2 provides a complement of the data 254 to a circuit node A2, as illustrated in FIG. 2, in response to the clocking signal 262 being at the second logical value, such as the logical zero. The logical NOR gate U3 similarly provides a complement of the $\overline{data}$ 256 to a circuit node A1, as illustrated in FIG. 2, in response to the clocking signal 262 being at the second logical value, such as the logical zero.

The selection circuitry 204 selectively couples the write circuitry 208 to the BL 250 and the $\overline{BL}$ 252 to allow the write circuitry 208 to write the electronic data onto to the BL 250 and the $\overline{BL}$ 252 for storage into the memory cell in the write mode of operation. In the exemplary embodiment illustrated in FIG. 2, the selection circuitry 204 includes n-type metal-oxide-semiconductor field-effect (NMOS) transistors N1 and N2. As illustrated in FIG. 2, the NMOS transistor N1 selectively couples the write circuitry 208 to the BL 250 in response to the logical NOR gate U1 providing the first logical value, such as the logical one, namely, when the select control signal 258 and the write enable control signal 260 are asserted, namely, set to the second logical value, such as the logical zero. The NMOS transistor N2 similar selectively couples the write circuitry 208 to the $\overline{BL}$ 252 in response to the logical NOR gate U1 providing the first logical value, such as the logical one, namely, when the select control signal 258 and the write enable control signal 260 are asserted, namely, set to the second logical value, such as the logical zero.

The isolation circuitry 206 causes the write circuitry 208 to be electrically isolated from the BL 250 and the $\overline{BL}$ 252 during the pre-charge phase of the write mode of operation. As described above, the BL 250 and the $\overline{BL}$ 252 are pre-charged to the first logical value, such as the logical one during this pre-charge phase of the write mode of operation. In other words, the isolation circuitry 206 effectively causes the high-impedance (Hi-Z) pathway to be formed between the write circuitry 208 and the BL 250 and the $\overline{BL}$ 252 during this pre-charge phase of the write mode of operation as described above. Thereafter, the isolation circuitry 206 causes the write circuitry 208 to be electrically coupled to the BL 250 and the $\overline{BL}$ 252 to allow the write circuitry 208 to write the data 254 and the $\overline{data}$ 256 to the BL 250 and the $\overline{BL}$ 252, respectively, for storage into the memory cell in the write mode of operation. In other words, the isolation circuitry 206 effectively causes the low-impedance (Low-Z) pathway to be formed between the write circuitry 208 and the BL 250 and the $\overline{BL}$ 252 as described above. In the exemplary embodiment illustrated in FIG. 2, the isolation circuitry 206 includes p-type metal-oxide-semiconductor field-effect (PMOS) transistors P1 and P2. As illustrated in FIG. 2, the PMOS transistor P1 and the PMOS transistor P2 electrically couple an operational voltage supply $V_{DD}$ to the write circuitry 208 when the write enable control signal 260 is asserted, namely, set to the second logical value, such as the logical zero. In this situation, the low-impedance (Low-Z) pathway is formed between the write circuitry 208 and the BL 250 and the $\overline{BL}$ 252 as described above. Otherwise, the PMOS transistor P1 and the PMOS transistor P2 electrically isolate the operational voltage supply $V_{DD}$ from the write circuitry 208 when the write enable control signal 260 is de-asserted, namely, set to the first logical value, such as the logical one. In this situation, the high-impedance (Hi-Z) pathway is formed between the write circuitry 208 and the BL 250 and the $\overline{BL}$ 252 as described above.

The write circuitry 208 writes the data 254 and the $\overline{data}$ 256 to the BL 250 and the $\overline{BL}$ 252, respectively, for storage into the memory cell in the write mode of operation. As illustrated in FIG. 2, the write circuitry 208 includes a first INVERTER circuit having a PMOS transistor P3 and an NMOS transistor N3 and a second INVERTER circuit having a PMOS transistor P4 and an NMOS transistor N4. As described above, the BL 250 and the $\overline{BL}$ 252 are pre-charged to the first logical value, such as the logical one, during the pre-charge phase of the write mode of operation. During this pre-charge phase of the write mode of operation, the isolation circuitry 206 electrically isolates the operational voltage supply $V_{DD}$ from the first INVERTER circuit and the second INVERTER circuit. In other words, the isolation circuitry 206 does not provide the operational voltage supply $V_{DD}$ to the first INVERTER circuit and the second INVERTER circuit during the pre-charge phase of the write mode of operation. As such, the circuit node A3 and the circuit node A4 as illustrated in FIG. 2 can be characterized as floating circuit nodes to form the high-impedance (Hi-Z) pathway between the write circuitry 208 and the BL 250 and the $\overline{BL}$ 252. In an exemplary embodiment, the circuit node A3 and the circuit node A4, when operating as the floating circuit nodes, can be considered to maintain the previous data 254 and the previous $\overline{data}$ 256, respectively, previously written to the BL 250 and the $\overline{BL}$ 252, respectively, by the write circuitry 208 in a previous write mode of operation.

When the write enable control signal 260 is asserted, namely, set to the second logical value, such as the logical zero, indicating the data 254 and the $\overline{\text{data}}$ 256 is to be written to the BL 250 and the $\overline{\text{BL}}$ 252, respectively, during a write phase of the write mode of operation, the isolation circuitry 206 electrically couples the operational voltage supply $V_{DD}$ to the first INVERTER circuit and the second INVERTER circuit. In other words, the isolation circuitry 206 provides the operational voltage supply $V_{DD}$ to the first INVERTER circuit and the second INVERTER circuit during the write phase of the write mode of operation. As such, the circuit node A3 and the circuit node A4 as illustrated in FIG. 2 can no longer be characterized as the floating circuit nodes, and form the low-impedance (Low-Z) pathway between the write circuitry 208 and the BL 250 and the $\overline{\text{BL}}$ 252. In this situation, the first INVERTER circuit performs a first logical inversion operation on the complement of the data 254 at the circuit node A2 to write the data 254 to the BL 250 for storage into the memory cell and the second INVERTER circuit performs a second logical inversion operation on the complement of the $\overline{\text{data}}$ 256 at the circuit node A1 to write the $\overline{\text{data}}$ 256 to the BL 252 for storage into the memory cell.

Exemplary Operation of the First Exemplary Write Driver

Figure 3:
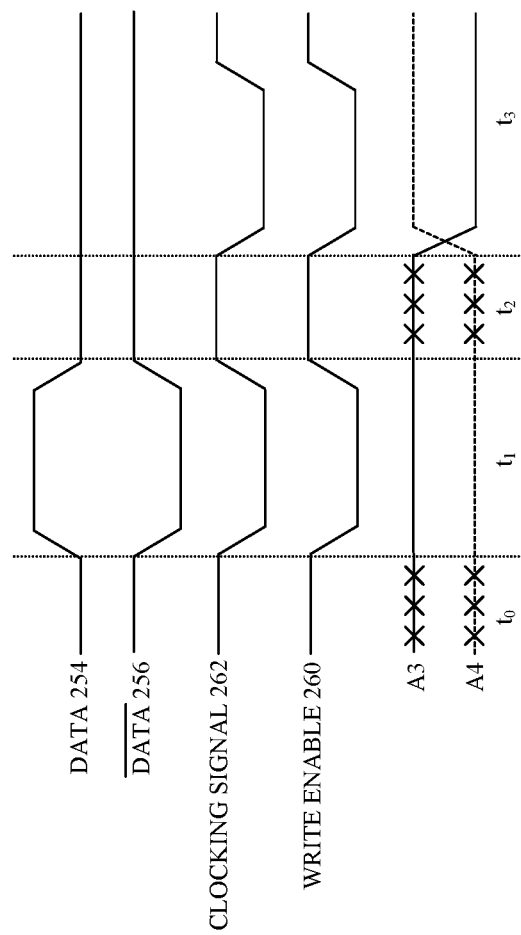
FIG. 3 graphically illustrates an exemplary operation of the first exemplary write driver according to an exemplary embodiment of the present disclosure.

FIG. 3 graphically illustrates an exemplary operation of the first exemplary write driver according to an exemplary embodiment of the present disclosure. As illustrated in FIG. 3, an exemplary operation 300 graphically illustrates operation of the write driver 200 in writing a first logical value, such as the logical one, and a second logical value, such as a logical zero, to a memory storage device, such as the memory storage device 100 as described above, during the write mode of operation.

During time $t_0$ of the write mode of operation, the exemplary operation 300 can be characterized as operating in the pre-charge phase of the write mode of operation. As illustrated in FIG. 3, the exemplary operation 300 de-asserts, for example, sets to the first logical value, the write enable control signal 260 and the clocking signal 262 indicating the write driver 200 is to operate in the pre-charge phase of the write mode of operation during the time $t_0$. In the exemplary embodiment illustrated in FIG. 3, the circuit node A3 and the circuit node A4 as illustrated in FIG. 2 can be characterized as the floating circuit nodes to form the high-impedance (Hi-Z) pathway between the write circuitry 208 and the BL 250 and the $\overline{\text{BL}}$ 252 in the pre-charge phase of the write mode of operation during the time $t_0$ of the write mode of operation. The circuit node A3 and the circuit node A4 are illustrated using "X"s in FIG. 3 indicating these circuit nodes are configured to be the floating nodes during the time $t_0$ of the write mode of operation.

During time $t_1$ of the write mode of operation, the exemplary operation 300 can be characterized as writing the data 254 to the memory storage device. As illustrated in FIG. 3, the exemplary operation 300 asserts, for example, sets to the second logical value, the write enable control signal 260 and the clocking signal 262 indicating the write driver 200 is to operate in the write mode of operation during the time $t_2$ to write the data 254 to the memory storage device. In the exemplary embodiment illustrated in FIG. 3, the circuit node A3 and the circuit node A4 as illustrated in FIG. 2 can be characterized as no longer being the floating circuit nodes to form the low-impedance (Low-Z) pathway between the write circuitry 208 and the BL 250 and the $\overline{\text{BL}}$ 252 during the time $t_2$ of the write mode of operation. In this situation, the exemplary operation 300 passes the data 254, for example, the first logical value, such as the logical one, onto to the BL 250 to be written to the memory storage device in the write mode of operation. The exemplary operation 300 similarly passes the $\overline{\text{data}}$ 256, for example, the second logical value, such as the logical zero, onto to the $\overline{\text{BL}}$ 252 to be written to the memory storage device in the write mode of operation.

During time $t_2$ of the write mode of operation, the exemplary operation 300 can be once again characterized as operating in the pre-charge phase of the write mode of operation. As illustrated in FIG. 3, the exemplary operation 300 once again de-asserts, for example, sets to the first logical value, the write enable control signal 260 and the clocking signal 262 indicating the write driver 200 is once again to operate in the pre-charge phase of the write mode of operation during the time $t_2$. In the exemplary embodiment illustrated in FIG. 3, the circuit node A3 and the circuit node A4 as illustrated in FIG. 2 can be characterized as the floating circuit nodes to form the high-impedance (Hi-Z) pathway between the write circuitry 208 and the BL 250 and the $\overline{\text{BL}}$ 252 in the pre-charge phase of the write mode of operation during the time $t_2$ of the write mode of operation. The circuit node A3 and the circuit node A4 are once again illustrated using "X"s in FIG. 3 indicating these circuit nodes are configured to be the floating nodes during the time $t_2$ of the write mode of operation.

During time $t_3$ of the write mode of operation, the exemplary operation 300 can once again be characterized as writing the data 254 to the memory storage device. As illustrated in FIG. 3, the exemplary operation 300 once again asserts, for example, sets to the second logical value, the write enable control signal 260 and the clocking signal 262 indicating the write driver 200 is once again to operate in the write mode of operation during the time $t_3$ to write the data 254 to the memory storage device. In the exemplary embodiment illustrated in FIG. 3, the circuit node A3 and the circuit node A4 as illustrated in FIG. 2 can be characterized as no longer being the floating circuit nodes to form the low-impedance (Low-Z) pathway between the write circuitry 208 and the BL 250 and the $\overline{\text{BL}}$ 252 during the time $t_2$ of the write mode of operation. In this situation, the exemplary operation 300 passes the data 254, for example, the second logical value, such as the logical zero, onto to the BL 250 to be written to the memory storage device in the write mode of operation. The exemplary operation 300 similarly passes the $\overline{\text{data}}$ 256, for example, the first logical value, such as the logical one, onto to the $\overline{\text{BL}}$ 252 to be written to the memory storage device in the write mode of operation.

Figure 4:
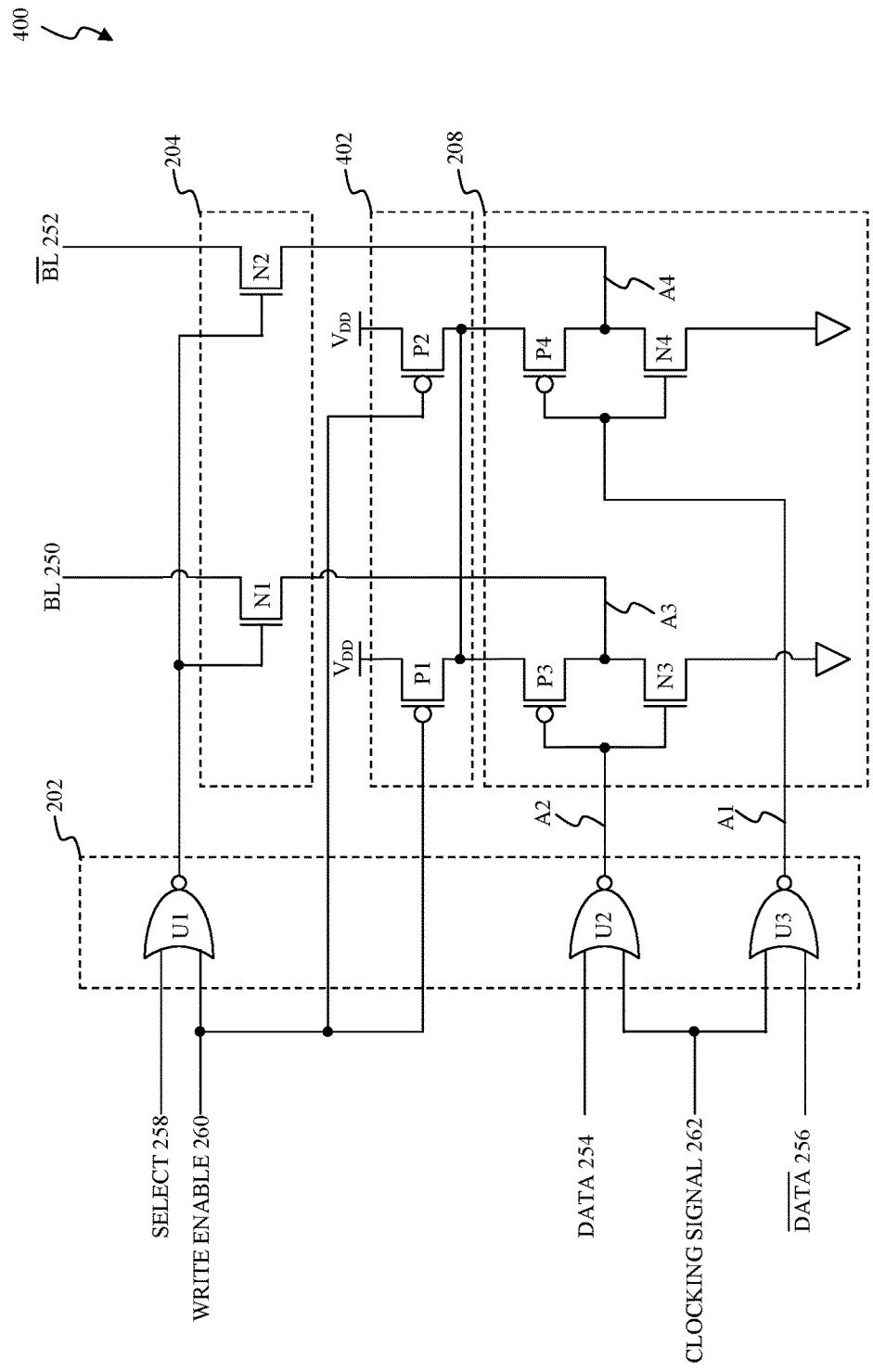
FIG. 4 illustrates a block diagram of a second exemplary write driver that can be implemented within the exemplary memory storage device according to an exemplary embodiment of the present disclosure.

Second Exemplary Write Driver can be Implemented within the Exemplary Memory Storage Device FIG. 4 illustrates a block diagram of a second exemplary write driver that can be implemented within the exemplary memory storage device according to an exemplary embodiment of the present disclosure. A write driver 400 writes electronic data, for example, a first logical value, such as a logical one, or a second logical value, such as a logical zero, into a memory cell from among memory cells of a memory array, such as one of the memory cells 106.1.1 through 106.m.n of the memory array 102 to provide an example, in a write mode of operation. As similarly described above in FIG. 2, the write driver 400 writes the electronic data to a bitline (BL) 250 and a $\overline{\text{BL}}$ 252, such as one of the BLs 110.1 through 110.m and one of the $\overline{\text{BLs}}$ $\overline{110.1}$ through $\overline{110.m}$, respectively, which corresponds to the memory cell. Before the write driver 400 writes the electronic data, the BL 250 and the $\overline{\text{BL}}$ 252 are charged, also referred to as pre-charged, to the first logical value, such as the logical one. In this pre-charge phase of the write mode of operation, the write driver 400 is electrically isolated from the BL 250 and the $\overline{BL}$ 252 as similarly described above in FIG. 2. In the exemplary embodiment illustrated in FIG. 4, the write driver 400 includes the logic circuitry 202, the memory cell selection circuitry 204, the write circuitry 208, and isolation circuitry 402. The write driver 400 can represent an exemplary embodiment of the write driver 104 as described above in FIG. 1. The write driver 400 shares many substantially similar features as the write driver 200 as described above in FIG. 2; therefore, only differences between the write driver 400 and the write driver 200 are to be discussed in further detail below.

The isolation circuitry 402 causes the write circuitry 208 to be electrically isolated from the BL 250 and the $\overline{BL}$ 252 during the pre-charge phase of the write mode of operation in a substantially similar manner as the isolation circuitry 206 as described above in FIG. 2. In the exemplary embodiment illustrated in FIG. 4 the isolation circuitry 402 includes the PMOS transistors P1 and P2. As illustrated in FIG. 4, the PMOS transistor P1 and the PMOS transistor P2 electrically couple the operational voltage supply $V_{DD}$ to the write circuitry 208 when the write enable control signal 260 is asserted, namely, set to the second logical value, such as the logical zero. In this situation, the low-impedance (Low-Z) pathway is formed between the write circuitry 208 and the BL 250 and the $\overline{BL}$ 252 in a substantially similar manner as the isolation circuitry 206 as described above in FIG. 2. Otherwise, the PMOS transistor P1 and the PMOS transistor P2 electrically isolate the operational voltage supply $V_{DD}$ from the write circuitry 208 when the write enable control signal 260 is de-asserted, namely, set to the first logical value, such as the logical one. In this situation, the high-impedance (Hi-Z) pathway is formed between the write circuitry 208 and the BL 250 and the $\overline{BL}$ 252 in a substantially similar manner as the isolation circuitry 206 as described above in FIG. 2. Unlike the isolation circuitry 206 as described above in FIG. 2, the PMOS transistor P1 is electrically coupled to the PMOS transistor P2 as illustrated in FIG. 4. In the exemplary embodiment illustrated in FIG. 4, a source of the PMOS transistor P1 is electrically coupled to a source of the PMOS transistor P2. This coupling of the PMOS transistor P1 and the PMOS transistor P2 causes a substantially similar potential to be provided to the first INVERTER circuit and the second INVERTER circuit when the PMOS transistor P1 and the PMOS transistor P2 electrically isolates the operational voltage supply $V_{DD}$ from the write circuitry 208.

Exemplary Operation of the Second Exemplary Write Driver

Figure 5:
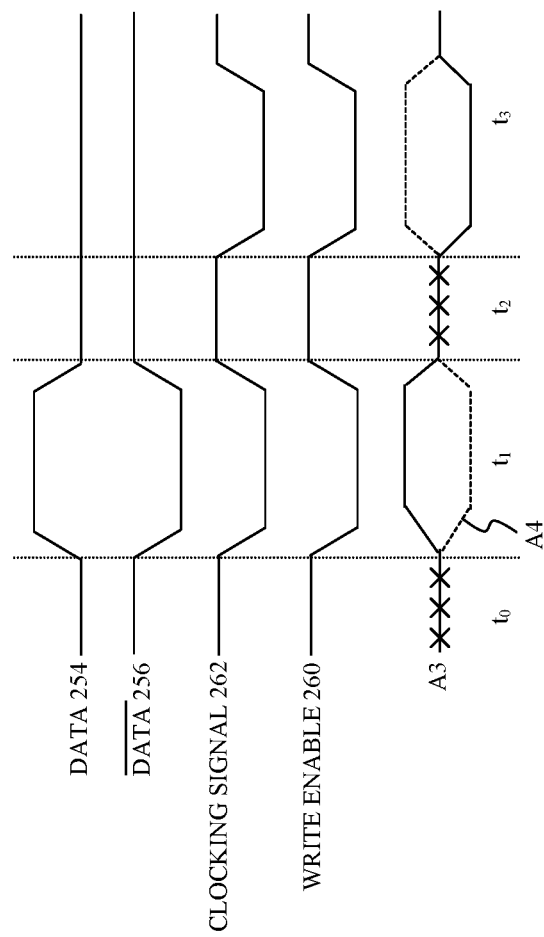
FIG. 5 graphically illustrates an exemplary operation of the first exemplary write driver according to an exemplary embodiment of the present disclosure.

FIG. 5 graphically illustrates an exemplary operation of the first exemplary write driver according to an exemplary embodiment of the present disclosure. As illustrated in FIG. 5, an exemplary operation 500 graphically illustrates operation of the write driver 400 in writing a first logical value, such as the logical one, and a second logical value, such as a logical zero, to a memory storage device, such as the memory storage device 100 as described above, during the write mode of operation.

During time t0 of the write mode of operation, the exemplary operation 500 can be characterized as operating in the pre-charge phase of the write mode of operation. As illustrated in FIG. 5, the exemplary operation 500 de-asserts, for example, sets to the first logical value, the write enable control signal 260 and the clocking signal 262 indicating the write driver 400 is to operate in the pre-charge phase of the write mode of operation during the time to. In the exemplary embodiment illustrated in FIG. 5, the circuit node A3 and the circuit node A4 as illustrated in FIG. 4 can be characterized as the floating circuit nodes to form the high-impedance (Hi-Z) pathway between the write circuitry 208 and the BL 250 and the 252 in the pre-charge phase of the write mode of operation during the time t0 of the write mode of operation. The circuit node A3 and the circuit node A4 are illustrated using "X"s in FIG. 5 indicating these circuit nodes are configured to be the floating nodes during the time t0 of the write mode of operation. And as illustrated in FIG. 5, the circuit node A3 and the circuit node A4 can be characterized as being at a substantially similar potential which results from the electrically coupling of the PMOS transistor P1 and the PMOS transistor P2 as described above in FIG. 4. In an exemplary embodiment, this substantially similar potential corresponds to an approximate midpoint between the first logical value, such as the logical one, and the second logical value, such as the logical zero.

During time t1 of the write mode of operation, the exemplary operation 500 can be characterized as operating in a write phase of the write mode of operation to write the data 254 to the memory storage device. As illustrated in FIG. 5, the exemplary operation 500 asserts, for example, sets to the second logical value, the write enable control signal 260 and the clocking signal 262 indicating the write driver 400 is to operate in the write phase of the write mode of operation during the time t1 to write the data 254 to the memory storage device. In the exemplary embodiment illustrated in FIG. 5, the circuit node A3 and the circuit node A4 as illustrated in FIG. 4 can be characterized as no longer being the floating circuit nodes to form the low-impedance (Low-Z) pathway between the write circuitry 208 and the BL 250 and the 252 during the time t1 of the write mode of operation. In this situation, the exemplary operation 500 passes the data 254, for example, the first logical value, such as the logical one, onto to the BL 250 to be written to the memory storage device in the write mode of operation. The exemplary operation 500 similarly passes the 256, for example, the second logical value, such as the logical zero, onto to the 252 to be written to the memory storage device in the write mode of operation.

During time t2 of the write mode of operation, the exemplary operation 500 can be once again characterized as operating in the pre-charge phase of the write mode of operation. As illustrated in FIG. 5, the exemplary operation 500 once again de-asserts, for example, sets to the first logical value, the write enable control signal 260 and the clocking signal 262 indicating the write driver 400 is once again to operate in the pre-charge phase of the write mode of operation during the time t2. In the exemplary embodiment illustrated in FIG. 5, the circuit node A3 and the circuit node A4 as illustrated in FIG. 4 can be characterized as the floating circuit nodes to form the high-impedance (Hi-Z) pathway between the write circuitry 208 and the BL 250 and the 252 in the pre-charge phase of the write mode of operation during the time t2 of the write mode of operation. The circuit node A3 and the circuit node A4 are once again illustrated using "X"s in FIG. 5 indicating these circuit nodes are configured to be the floating nodes during the time t2 of the write mode of operation. And as illustrated in FIG. 5, the circuit node A3 and the circuit node A4 can be characterized as being at a substantially similar potential which results from the electrically coupling of the PMOS transistor P1 and the PMOS transistor P2 as described above in FIG. 4. In an exemplary embodiment, this substantially similar potential corresponds to an approximate midpoint between the first logical value, such as the logical one, and the second logical value, such as the logical zero.

During time $t_3$ of the write mode of operation, the exemplary operation 500 can once again be characterized can be characterized as operating in the write phase of the write mode of operation to write the data 254 to the memory storage device. As illustrated in FIG. 5, the exemplary operation 500 once again asserts, for example, sets to the second logical value, the write enable control signal 260 and the clocking signal 262 indicating the write driver 200 is once again to operate in the write phase of the write mode of operation during the time $t_3$ to write the data 254 to the memory storage device. In the exemplary embodiment illustrated in FIG. 5, the circuit node A3 and the circuit node A4 as illustrated in FIG. 4 can be characterized as no longer being the floating circuit nodes to form the low-impedance (Low-Z) pathway between the write circuitry 208 and the BL 250 and the $\overline{BL}$ 252 during the time $t_2$ of the write mode of operation. In this situation, the exemplary operation 500 passes the data 254, for example, the second logical value, such as the logical zero, onto to the BL 250 to be written to the memory storage device in the write mode of operation. The exemplary operation 500 similarly passes the $\overline{data}$ 256, for example, the first logical value, such as the logical one, onto to the $\overline{BL}$ 252 to be written to the memory storage device in the write mode of operation.

As described above in FIG. 3, the circuit node A3 and the circuit node A4 are are configured to be the floating nodes during the time $t_0$ and the time $t_2$ of the write mode of operation. In the exemplary embodiment illustrated in FIG. 3, the circuit node A3 floats to approximately the first logical value, such as the logical one, and the circuit node A4 floats to approximately the second logical value, such as the logical zero during the time to and the time $t_2$ of the write mode of operation. As illustrated in FIG. 3, the circuit node A3 transitions from the first logical value, such as the logical one, to the second logical value, such as the logical zero, as the data 254 transitions from the first logical value, such as the logical one, to the second logical value, such as the logical zero. The circuit node A4 similarly transitions from the second logical value, such as the logical zero, to the first logical value, such as the logical one, as the $\overline{data}$ 256 transitions from the second logical value, such as the logical zero to the first logical value, such as the logical one.

Similarly, as described above in FIG. 5, the circuit node A3 and the circuit node A4 are configured to be the floating nodes during the time $t_0$ and the time $t_2$ of the write mode of operation. In the exemplary embodiment illustrated in FIG. 5, the circuit node A3 and the circuit node A4 float to the approximate midpoint between the first logical value, such as the logical one, and the second logical value, such as the logical zero. As illustrated in FIG. 5, the circuit node A3 transitions from the approximate midpoint to the second logical value, such as the logical zero, as the data 254 transitions from the first logical value, such as the logical one, to the second logical value, such as the logical zero. The circuit node A4 similarly transitions from the approximate midpoint to the first logical value, such as the logical one, as the $\overline{data}$ 256 transitions from the second logical value, such as the logical zero, to the first logical value, such as the logical one. In some situations, this transitioning of the circuit node A3 and the circuit node A4 as illustrated in FIG. 5 consumes less power than the transitioning of the circuit node A3 and the circuit node A4 as illustrated in FIG. 3 as shown below in TABLE 1.

|  | 25% Data Change | 50% Data Change | 75% Data Change | 100% Data Change |
| --- | --- | --- | --- | --- |
| Number of Full Pre-Charge |  |  |  |  |
| CONVENTIONAL | 4 | 4 | 4 | 4 |
| write driver 200 | 1 | 2 | 3 | 4 |
| write driver 400 | 4 Half Pre-Charge | 4 Half Pre-Charge | 4 Half Pre-Charge | 4 Half Pre-Charge |
| Power Saving Ratio |  |  |  |  |
| write driver 200 | 75% | 50% | 25% | 0% |
| write driver 400 | 50% | 50% | 50% | 50% |

As illustrated in TABLE 1, the "data change" represents a number of transitions between the first logical value, such as the logical one, to the second logical value, such as the logical zero, for the $\overline{data}$ 254 and/or the data 256 during a four cycle period. For example, the "25% Data Change" indicates the data 254 and/or the $\overline{data}$ 256 transitions one time between the first logical value, such as the logical one, to the second logical value, such as the logical zero, during the four cycle period. The write driver 200 as described above in FIG. 2 and FIG. 3 undergoes one (1) full pre-charge of the circuit node A3 and the circuit node A4 from the second logical value, such as the logical zero to the first logical value, during the "25% Data Change", two (2) full pre-charges of the circuit node A3 and the circuit node A4 during the "50% Data Change", three (3) full pre-charges of the circuit node A3 and the circuit node A4 during the "75% Data Change", and four (4) full pre-charges of the circuit node A3 and the circuit node during the "100% Data Change". The write driver 400 as described above in FIG. 4 and FIG. 5 undergoes four (4) half pre-charges of the circuit node A3 and the circuit node A4 from the approximate midpoint to the first logical value, such as the logical one, and/or the second logical value, such as the logical zero, during the "25% Data Change", the "50% Data Change", the "75% Data Change", and the "100% Data Change".

In some situations, as illustrated in TABLE 1, the write driver 200 and/or the write driver 400 conserves power over a conventional write driver which undergoes four (4) full pre-charges of its internal circuit nodes during the four cycle period during the "25% Data Change", the "50% Data Change", the "75% Data Change", and the "100% Data Change". As shown in TABLE 1, the write driver 200 has a 75% power saving ratio for its one (1) full pre-charge of the circuit node A3 and the circuit node A4 during the "25% Data Change", a 50% power saving ratio for its two (2) full pre-charges of the circuit node A3 and the circuit node A4 during the "50% Data Change," a 25% power saving ratio for its three (3) full pre-charges of the circuit node A3 and the circuit node A4 during the "75% Data Change", and a 0% power saving ratio for its four (4) full pre-charges of the circuit node A3 and the circuit node A4 during the "100% Data Change" when compared to power needed for the four (4) full pre-charges of the internal circuit nodes of the conventional write driver during the "25% Data Change", the "50% Data Change", the "75% Data Change", and the "100% Data Change". The write driver 400 has a 50% power saving ratio for its four (4) half pre-charges, equivalent to (2) full pre-charges, of the circuit node A3 and the circuit node A4 during the "25% Data Change", the "50% Data Change", the "75% Data Change", and the "100% Data Change" as when compared to power needed for the four (4) full pre-charges of the internal circuit nodes of the conventional write driver during the "25% Data Change", the "50% Data Change", the "75% Data Change", and the "100% Data Change".

Exemplary Operational Control Flow for the Exemplary Memory Storage Device

Figure 6:
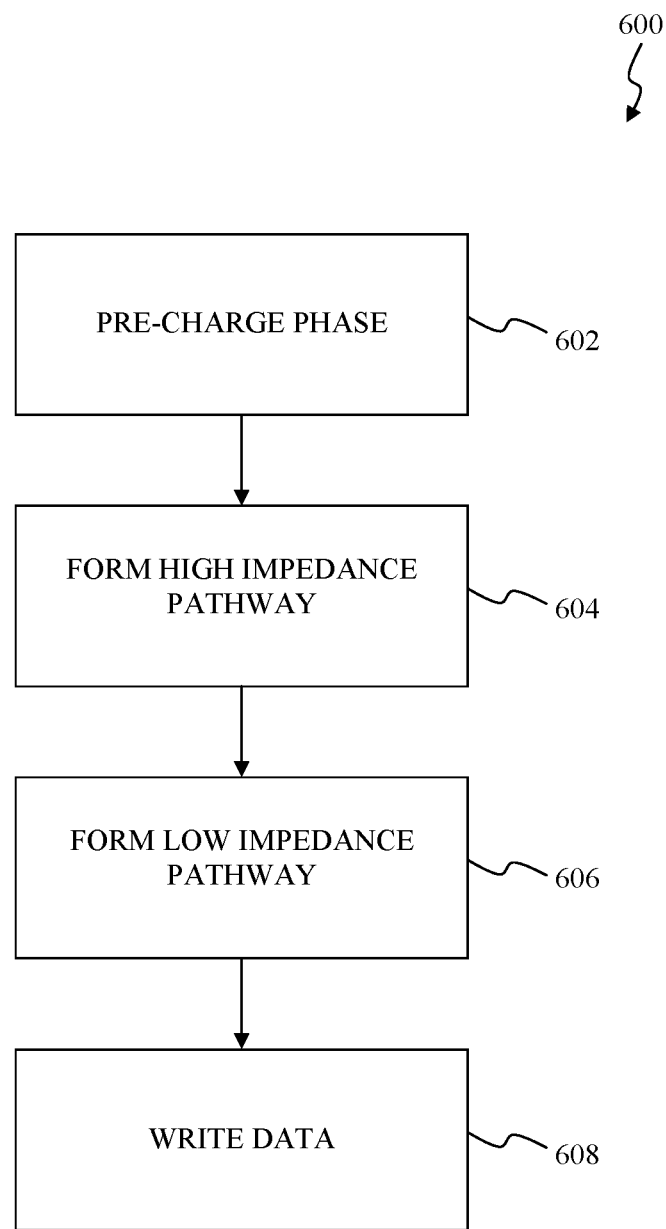
FIG. 6 illustrates a flowchart of exemplary operations for the exemplary memory storage device according to an exemplary embodiment of the present disclosure.

FIG. 6 illustrates a flowchart of exemplary operations for the exemplary memory storage device according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 600 for an exemplary memory storage device, such as the memory storage device 100 as described above in FIG. 1, operating in a write mode of operation.

At operation 602, the operational control flow 600 enters into a pre-charge phase of the write mode of operation. For example, the operational control flow 600 can de-assert, for example, set to the first logical value, various control signals of the exemplary memory storage device, such as the write enable control signal 260 and/or the clocking signal 262, to enter into the pre-charge phase of the write mode of operation. In the exemplary embodiment illustrated in FIG. 6, the operational control flow 600 asserts a WL, such as one of the WLs from among the WLs 108.1 through 108.$n$ to select a memory cell, such as one of the memory cells 106.1.1 through 106.$m.n$, of the exemplary memory storage device. Thereafter, the operational control flow 600 charges, also referred to as pre-charges, a BL, such as one of the BLs from among the BLs 110.1 through 110.$m$ as described above in FIG. 1, and a corresponding $\overline{BL}$, such as one of the $\overline{BLs}$ $\overline{110.1}$ through $\overline{110.m}$ as described above in FIG. 1, to the first logical value, such as the logical one in the pre-charge phase of the write mode of operation.

At operation 604, the operational control flow 600 electrically isolates a write driver, such as the write driver 104, of the exemplary memory storage device from the BL and the corresponding $\overline{BL}$ of operation 602. The operational control flow 600 effectively provides the high-impedance (Hi-Z) pathway between the write driver and the BL and the corresponding $\overline{BL}$ as described above in FIG. 1 at the operation 604.

At operation 606, the operational control flow 600 enters into a write phase of the write mode of operation. For example, the operational control flow 600 can assert, for example, set to the second logical value, the various control signals of operation 602 to enter into the write phase of the write mode of operation. During the write phase of the write mode of operation, the operational control flow 600 electrically couples the write driver of operation 604 to the BL and the corresponding $\overline{BL}$ of operation 602 to allow the write driver of operation 604 to write electronic data, for example, the first logical value, such as the logical one, or a second logical value, such as a logical zero, into the memory cell of operation 602. The operational control flow 600 effectively provides the low-impedance (Low-Z) pathway between the write driver of operation 604 and the BL and the corresponding $\overline{BL}$ of operation 602 as described above in FIG. at the operation 606.

At operation 608, the operational control flow 600 writes the electronic data on the BL and the corresponding $\overline{BL}$ of operation 602 into the memory cell of operation 602 in the write phase of the write mode of operation.

CONCLUSION

The foregoing Detailed Description discloses a memory storage device, having a memory cell and a write driver. The write driver is isolated from the memory cell during a pre-charge phase of a write mode of operation and is coupled to the memory cell during a write phase of the write mode of operation. The memory storage device charges a data line between the memory cell and the write driver to a logical value during the pre-charge phase of the write mode of operation. The write driver being writes data to the memory cell during the write phase of the write mode of operation.

The foregoing Detailed Description additionally discloses a write driver for a memory storage device. The write driver includes write circuitry and isolation circuitry. The write circuitry writes data to a memory cell during a write phase of a write mode of operation. The isolation circuitry isolates the write circuitry from an operational voltage supply during the pre-charge phase of the write mode of operation to isolate the write circuitry from the memory cell and couples the write circuitry to the operational voltage supply during the write phase of the write mode of operation to couple the write circuitry to the memory cell. The memory storage device charges a data line between the memory cell and the write driver to a logical value during the pre-charge phase of the write mode of operation.

The foregoing Detailed Description further discloses a method for operating a memory storage device. The method includes isolating a write driver from a data line between a memory cell and the write driver during a pre-charge phase of a write mode of operation, charging the data line to a logical value during a pre-charge phase of a write mode of operation, coupling the write driver to the data line during a write phase of the write mode of operation, and writing data from the write driver to the memory cell during the write phase of the write mode of operation.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory storage device, comprising:
a memory cell; and
a write driver configured to:
form a high-impedance pathway between the write driver and the memory cell to isolate the write driver from the memory cell during a pre-charge phase of a write mode of operation, wherein an output circuit node of the write driver is characterized as being a floating circuit node to form the high-impedance pathway, and wherein the memory storage device is configured to charge a data line between the memory cell and the write driver during the pre-charge phase of the write mode of operation, and
form a low-impedance pathway between the write driver and the memory cell to couple the write driver to the memory cell during a write phase of the write mode of operation, the write driver being further configured to write data to the memory cell during the write phase of the write mode of operation.

2. The memory storage device of claim 1, wherein the high-impedance pathway is in an order of Megaohms (MΩs).

3. The memory storage device of claim 1, wherein the floating circuit node is configured to prevent an unwanted leakage pathway between the memory cell and the write driver.

4. The memory storage device of claim 1, wherein the low-impedance pathway is in an order of ohms (Ωs).

5. The memory storage device of claim 1, wherein the write driver comprises:
write circuitry configured to write the data to the memory cell during the write phase of the write mode of operation; and
isolation circuitry configured to:
isolate the write circuitry from an operational voltage supply during the pre-charge phase of the write mode of operation to form the high-impedance pathway, and
couple the write circuitry to the operational voltage supply during the write phase of the write mode of operation to form the low-impedance pathway.

6. The memory storage device of claim 5, wherein the write circuitry comprises:
a p-type metal-oxide-semiconductor field-effect (PMOS) transistor and an n-type metal-oxide-semiconductor field-effect (NMOS) transistor arranged to form an inverter, and
wherein the isolation circuitry is further configured to:
isolate the PMOS transistor from the operational voltage supply during the pre-charge phase of the write mode of operation to form the high-impedance pathway, and
couple the PMOS transistor to the operational voltage supply during the write phase of the write mode of operation to form the low-impedance pathway.

7. The memory storage device of claim 5, wherein the isolation circuitry comprises:
a p-type metal-oxide-semiconductor field-effect (PMOS) transistor configured to:
isolate the write circuitry from the operational voltage supply during the pre-charge phase of the write mode of operation to form the high-impedance pathway, and
couple the write circuitry to the operational voltage supply during the write phase of the write mode of operation to form the low-impedance pathway.

8. The memory storage device of claim 5, wherein the write driver further comprises:
logic circuitry configured to:
cause the write circuitry and the isolation circuitry to operate in the pre-charge phase of the write mode of operation in response to a control signal being at a first logical value, and
cause the write circuitry and the isolation circuitry to operate in the write phase of the write mode of operation in response to the control signal being at a second logical value.

9. The memory storage device of claim 1, wherein the memory cell is from among a plurality of memory cells of a memory array, and
wherein the memory storage device is configured to assert the data line to select the memory cell.

10. The memory storage device of claim 1, wherein the memory cell is configured to maintain data previously written to the memory cell in a previous write mode of operation when the high-impedance pathway is formed between the write driver and the memory cell.

11. A write driver for a memory storage device, the write driver comprising:
write circuitry configured to write data to a memory cell during a write phase of a write mode of operation; and
isolation circuitry configured to:

isolate the write circuitry from an operational voltage supply during the pre-charge phase of the write mode of operation to form a high-impedance pathway between the write circuitry and the memory cell, wherein an output circuit node of the write circuitry is characterized as being a floating circuit node to form the high-impedance pathway, and wherein the memory storage device is configured to charge a data line between the memory cell and the write driver during the pre-charge phase of the write mode of operation, and couple the write circuitry to the operational voltage supply during the write phase of the write mode of operation to form a low-impedance pathway between the write circuitry and the memory cell.

12. The write driver of claim 11, wherein the isolation circuitry comprises:
a p-type metal-oxide-semiconductor field-effect (PMOS) transistor configured to:
isolate the write circuitry from the operational voltage supply during the pre-charge phase of the write mode of operation to form the high-impedance pathway, and
couple the write circuitry to the operational voltage supply during the write phase of the write mode of operation to form the low-impedance pathway.

13. The write driver of claim 11, wherein the write circuitry comprises:
a p-type metal-oxide-semiconductor field-effect (PMOS) transistor and an n-type metal-oxide-semiconductor field-effect (NMOS) transistor arranged to form an inverter, and
wherein the isolation circuitry is further configured to:
isolate the PMOS transistor from the operational voltage supply during the pre-charge phase of the write mode of operation to form the high-impedance pathway, and
couple the PMOS transistor to the operational voltage supply during the write phase of the write mode of operation to form the low-impedance pathway.

14. The write driver of claim 11, wherein the isolation circuitry is configured to:
isolate the write circuitry from the operational voltage supply during the pre-charge phase of the write mode of operation to form the high-impedance pathway between the write circuitry and the data line, and
couple the write circuitry to the operational voltage supply during the write phase of the write mode of operation to form the high-impedance pathway between the write circuitry and the data line.

15. The write driver of claim 11, wherein the memory cell is configured to maintain data previously written to the memory cell in a previous write mode of operation when the high-impedance pathway is formed between the write driver and the memory cell.

16. The write driver of claim 11, further comprising:
logic circuitry configured to:
cause the write circuitry and the isolation circuitry to operate in the pre-charge phase of the write mode of operation in response to a control signal being at a first logical value, and
cause the write circuitry and the isolation circuitry to operate in the write phase of the write mode of operation in response to the control signal being at a second logical value.

17. A method for operating a memory storage device, the method comprising:
isolating, by the memory storage device, a write driver from a data line between a memory cell and the write driver during a pre-charge phase of a write mode of operation to form a high-impedance pathway between the write driver and the data line, wherein an output circuit node of the write driver is characterized as being a floating circuit node to form the high-impedance pathway;
charging, by the memory storage device, the data line during a pre-charge phase of a write mode of operation;
coupling, by the memory storage device, the write driver to the data line during a write phase of the write mode of operation to form a low-impedance pathway between the write driver and the data line; and
writing, by the memory storage device, data from the write driver to the memory cell during the write phase of the write mode of operation.

18. The method of claim 17, wherein the high-impedance pathway is in an order of Megaohms (MΩs).

19. The method of claim 17, wherein the low-impedance pathway is in an order of ohms (Ωs).

20. The method of claim 17, further comprising:
causing, by the memory storage device, the write driver to operate in the pre-charge phase of the write mode of operation in response to a control signal being at a first logical value; and
causing, by the memory storage device, the write driver to operate in the write phase of the write mode of operation in response to the control signal being at a second logical value.

* * * * *